(12) United States Patent
Camilo Gomes et al.

(10) Patent No.: US 9,858,795 B1
(45) Date of Patent: Jan. 2, 2018

(54) DATA CENTER AISLE OBSTRUCTION DETECTION

(71) Applicant: Amazon Technologies, Inc., Seattle, WA (US)

(72) Inventors: Alexandre José Camilo Gomes, Jundiai (BR); Stephen Anthony Brown, Jundiai (BR)

(73) Assignee: Amazon Technologies, Inc., Seattle, WA (US)

( * ) Notice: Subject to any disclaimer, the term of this patent is extended or adjusted under 35 U.S.C. 154(b) by 96 days.

(21) Appl. No.: 14/751,692

(22) Filed: Jun. 26, 2015

(51) Int. Cl.
*G08B 13/183* (2006.01)
*G08B 21/18* (2006.01)

(52) U.S. Cl.
CPC ................................. *G08B 21/182* (2013.01)

(58) Field of Classification Search
CPC .. G08B 13/18; G08B 13/1895; G08B 13/183; G08B 13/124
USPC ............. 340/3.6, 3.62, 545.3, 555, 556, 557
See application file for complete search history.

(56) References Cited

U.S. PATENT DOCUMENTS

| | | | | |
|---|---|---|---|---|
| 6,392,747 B1* | 5/2002 | Allen | ................... | G01S 7/4802 356/141.1 |
| 2004/0246122 A1* | 12/2004 | Bailey, III | ......... | A47G 29/1214 340/506 |
| 2009/0091446 A1* | 4/2009 | Jang | ...................... | G01S 17/026 340/557 |
| 2015/0379843 A1* | 12/2015 | Ye | ........................ | G08B 13/181 340/552 |

FOREIGN PATENT DOCUMENTS

WO    WO2014/121627    * 8/2014

* cited by examiner

*Primary Examiner* — Kevin Kim
(74) *Attorney, Agent, or Firm* — Baker & Hostetler LLP (57) ABSTRACT

A system for detecting air flow obstruction in a data center is described. The system is configured to detect that an air outlet of the data center has been obstructed. A time period during which the air outlet is obstructed is determined. An alarm is activated when the air outlet has been obstructed for a predetermined time period.

20 Claims, 7 Drawing Sheets

DATA CENTER AISLE OBSTRUCTION DETECTION

BACKGROUND

A data center is a facility that houses computer systems and various networking, storage, and other related components. Many organizations and businesses utilize data center resources to provide computing and information services to support their day-to-day operations. Data centers may provide computing services to businesses and individuals as a remote computing service or to provide "software as a service" (e.g., cloud computing). The services provided by data centers are typically implemented with large quantities of computing equipment at the data center. It is important to efficiently perform maintenance activities for the computing equipment.

BRIEF DESCRIPTION OF DRAWINGS

References are made to the accompanying drawings that form a part hereof, and that show, by way of illustration, specific embodiments or examples. The drawings herein are not drawn to scale. Like numerals represent like elements throughout the several figures. In the figures, reference numbers may be reused to indicate correspondence between referenced elements. The drawings are provided to illustrate example embodiments described herein and are not intended to limit the scope of the disclosure.

DETAILED DESCRIPTION

A data center provides computing resources to users via user computers over a communications network such as the Internet. The computing resources can include various types of resources, such as data processing resources, data storage resources, data communication resources, and the like. Data centers typically serve many hundreds or thousands of customers, and can house thousands of servers and other computing equipment. A data center, for example, may have hundreds or thousands of equipment racks that can house thousands of servers and other computing devices.

Figure 1:
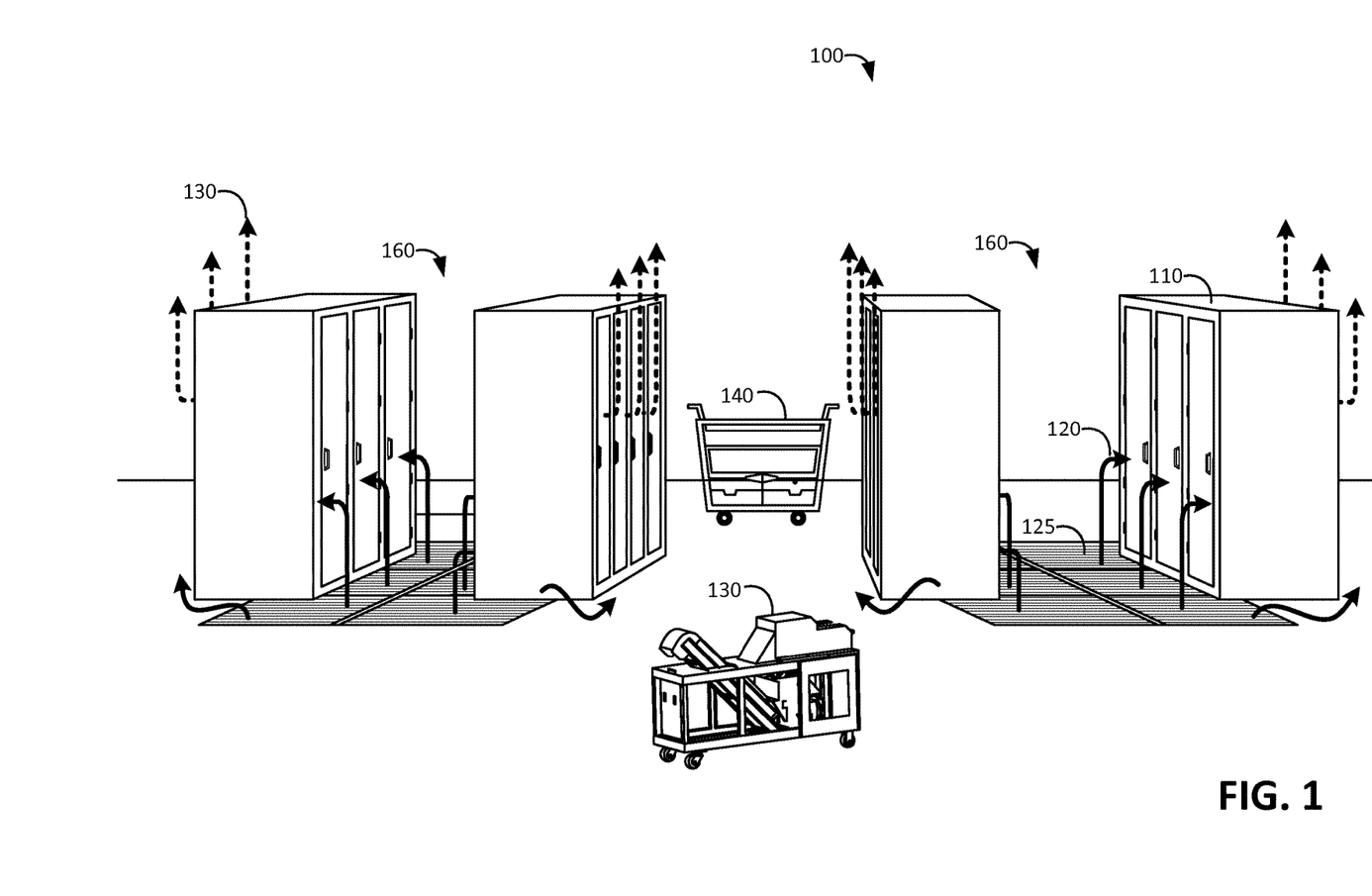
FIG. 1 illustrates an example portion of a data center according to some embodiments.

Data centers must manage environmental conditions to ensure efficient operation of the computing equipment. Data centers may utilize heating, ventilating, and air conditioning (HVAC) systems to pump pressurized air to maintain proper equipment temperature ranges. Computing equipment in a data center typically takes in cooling air at the front of the equipment and exhausts hot air at the back of the equipment. Data centers typically separate hot and cold airflows to prevent recirculation of hot air exhausted from the computing equipment and to reduce cooling costs. This can be achieved by placing equipment with the front of the equipment racks facing the same direction in a given row, thus causing a consistent airflow direction throughout the equipment racks. Rows of equipment racks may then be oriented so that the fronts of the computing equipment face each other and the backs of the computing equipment face each other in alternating fashion. Such an arrangement results in alternating hot aisles and cold aisles. Referring to FIG. 1, illustrated is an example arrangement of equipment racks 110 in a data center 100. Solid arrows 120 illustrate cold air being circulated upward from airflow outlets 125 that receive cooling air from an underfloor source. The dashed arrows 130 illustrate hot air exhausted from the equipment racks flowing upward. Also illustrated in FIG. 1 are a device management cart 130 and a maintenance cart 140. Depending on where the carts are placed by maintenance personnel during maintenance operations, the carts may impede the flow of cold air being circulated upward from airflow outlets 125.

The operation of a data center requires the continuous monitoring and maintenance of the data center's equipment to ensure effective utilization of the computing equipment while avoiding or minimizing equipment failures. In a hot aisle/cold aisle arrangement, the data center must monitor the environmental conditions to avoid issues that can arise due to hot air recirculation and mixing, and obstruction or failure of cold air outlets. Such issues can result in hot spots that can allow equipment to operate in non-optimal temperature ranges. The data center may monitor for such conditions by installing temperature sensors to detect such hot spots and to alert data center personnel for troubleshooting and resolution of the issue.

One problem that can arise is that data center personnel may inadvertently place work carts over the cold air outlets. The cold air outlets may include floor diffusers or other cold air distribution mechanisms. Data center personnel may also obstruct the cold air outlets by standing over the outlets. Such obstructions can temporarily block the flow of cooling air in a particular area of a cold aisle, causing local hot spots or preventing cooling air from reaching the temperature sensors. This can trigger alarms that require investigation by maintenance personnel to determine the source of the problem. The expenditure of resources to troubleshoot and resolve such avoidable events can be an unnecessary drain on a data center's resources and increase the cost of maintaining a data center. Furthermore, troubleshooting of such events may result in unnecessary shutdown of equipment, which may ultimately affect the availability of computing equipment and thus the ability of the data center to provide continuous access to resources by the data center's customers.

Described in this disclosure are systems and methods for detecting obstructions of cold aisle air flow in a data center and generating notifications of the obstructions. In one embodiment, a detection and notification system can be installed in a data center to provide local and/or remote notifications in the event that a cold air outlet is blocked for a predetermined period of time. By providing such a notification, potential obstruction events can be avoided or resolved before a temperature alarm is registered and a maintenance event is triggered. One advantage of providing notifications of potential obstructions is that the notifications can be used to change the habits and actions of data center maintenance personnel so as to avoid behaviors that are likely to result in the unintentional blocking of cooling air to the temperature sensors on the equipment racks.

In one embodiment, energy emitters may be used to detect the presence of a person or object that may obstruct the cold air outlets. For example, one or more laser detection devices may be used to detect a potential obstruction of a cold air outlet. The laser detection devices may be placed so as to detect objects or personnel in a path between the cold air outlets and the temperature sensors. When a laser detection device is located in the proximity of a cold air outlet and detects a cart or a person along a line-of-sight of the laser detection device, a timer may be used to determine if the cart or a person remains in place long enough to cause a cooling air blockage event. The timer may, for example, determine if the cart or a person remains in place for greater than a predetermined threshold time period (e.g., 40 seconds). If the line-of-sight of the laser detection device remains blocked for the predetermined threshold time period, then it may be assumed that the air flow outlet has been obstructed. The laser detection device may provide a signal to an alarm which may activate appropriate notification actions, such as generating an audio alarm and illuminating a warning light, as configured by the data center operators. The sound level of the alarm may be configured to generate a sufficient sound level for personnel in the general vicinity of the cold aisle to hear above the ambient noise of the equipment. Additionally, a number of warning lights may be installed at locations throughout the cold aisle to increase the likelihood that personnel will view the lights when activated. The alarm may be deactivated when the obstruction has been removed and is no longer sensed by the laser detection device.

Referring again to FIG. 1, illustrated is data center 100 that includes four computing equipment racks 110, forming two cold air aisles 160. The computing equipment racks 110 may generally be situated throughout the data center 100. Each of the computing equipment racks 110 may house a number of computing, storage, and other devices. The data center 100 may house hundreds or thousands of such computing equipment racks 110 in various configurations, and the computing equipment racks 110 may be further segregated into rooms, bays, or other such structures. The warning lights may be installed through the data center 100, or may be localized to specific cold air aisles.

While the present disclosure describes examples in terms of hot and cold aisles in a data center, it should be understood that the disclosed principles may be applied to other computing environments where monitoring of environmental conditions is desired.

Figure 2:
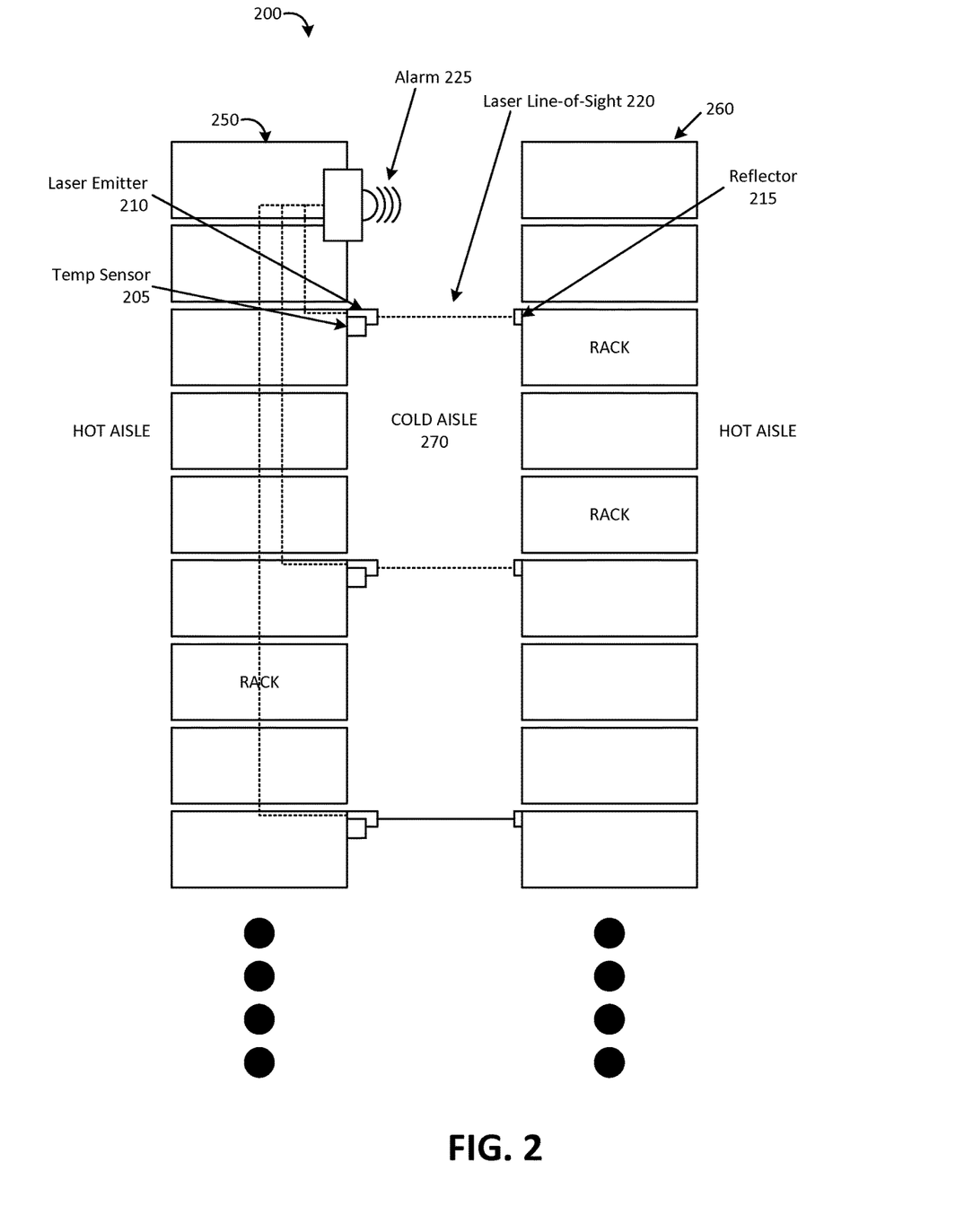
FIG. 2 illustrates an example system for managing computing resources in a data center according to some embodiments.

Referring to FIG. 2, illustrated is an example system 200 for detecting air flow obstruction in a data center. In an embodiment, system 200 may be an integrated system that can perform the operations of sensing obstruction of a cold air outlet of the data center and activate a signal when the obstruction is sensed. The system 200 may be configured to determine a time period during which the obstruction is sensed, and generate an indication in response to the obstruction being sensed for a predetermined time period. The system 200 may further be configured to activate an alarm in response to receiving the indication from the timer. In some embodiments, the system 200 may further be capable of communicating with networks and systems of the data center to send and receive information for alarm events, and providing notifications that obstructions are sensed or removed.

Referring to FIG. 2, illustrated are equipment racks 250 and 260 that form a cold air aisle 270. A temperature sensor 205 may be installed on equipment rack 250 and may be configured to sense the ambient temperature. In this example, a number of laser emitters 210 are installed to generate laser lines-of-sight 220 across the cold aisle 270 to a number of reflectors 215 that are located across the cold aisle 270. Each emitter 210 also comprises a detector to determine whether the laser light is reflected back to the emitter 210 by the reflector 215. The laser emitters 210 are communicatively coupled to alarm 225. When an obstruction is detected by one of the laser emitters 210, the laser emitters 210 may start a timer (not shown) to determine if the obstruction remains in place for a predetermined time period. If the laser emitters 210 determine that the obstruction has remained in place for the predetermined time period, a signal may be sent to the alarm 225 to activate an audio or visual alarm.

The laser emitters 210 may also be communicatively coupled to other systems of the data center. For example, the laser emitters 210 may include a wired or wireless network interface component that is configured to communicate with available networks using technologies, such as Wifi or BLUETOOTH, and exchange information with other systems of the data center. The laser emitters 210 may send information regarding the location and time of any cooling airflow obstruction events.

For example, the laser emitters 210 may communicate with a data center management system (not shown) and access a maintenance database or data logs. Each laser emitters 210 may be uniquely identified at the data center to allow for identification and management of the laser emitters 210.

As shown in the example embodiment of FIG. 2, a laser emitter, detector, and timer may be housed in a single device with the standalone reflector located across the cold aisle. The laser detector may be an optical detector and may include circuitry to detect the interruption of the laser light emitted by the emitter and begin a countdown timer. For example, a countdown timer may comprise a charging capacitor and potentiometer. The countdown timer may include an adjustable time threshold that implements the predetermined time period after which an alarm is generated. In one embodiment, the countdown timer may include a relay that is configured to be energized when the adjustable time threshold is reached, causing a signal to be sent to the alarm.

As shown in this embodiment, multiple laser emitters may be communicatively coupled to a single alarm device. The laser emitters may be installed, for example, to detect obstructions for all cold air outlets of one cold aisle, allowing for a single alarm device to be used for each cold aisle.

In some embodiments, the laser emitter, detector, and timer may be configured to be powered by a readily available power source at the equipment racks and to minimize power consumption. For example, the laser emitter, detector, and timer may be configured to receive a 12 VDC power source.

Figure 3:
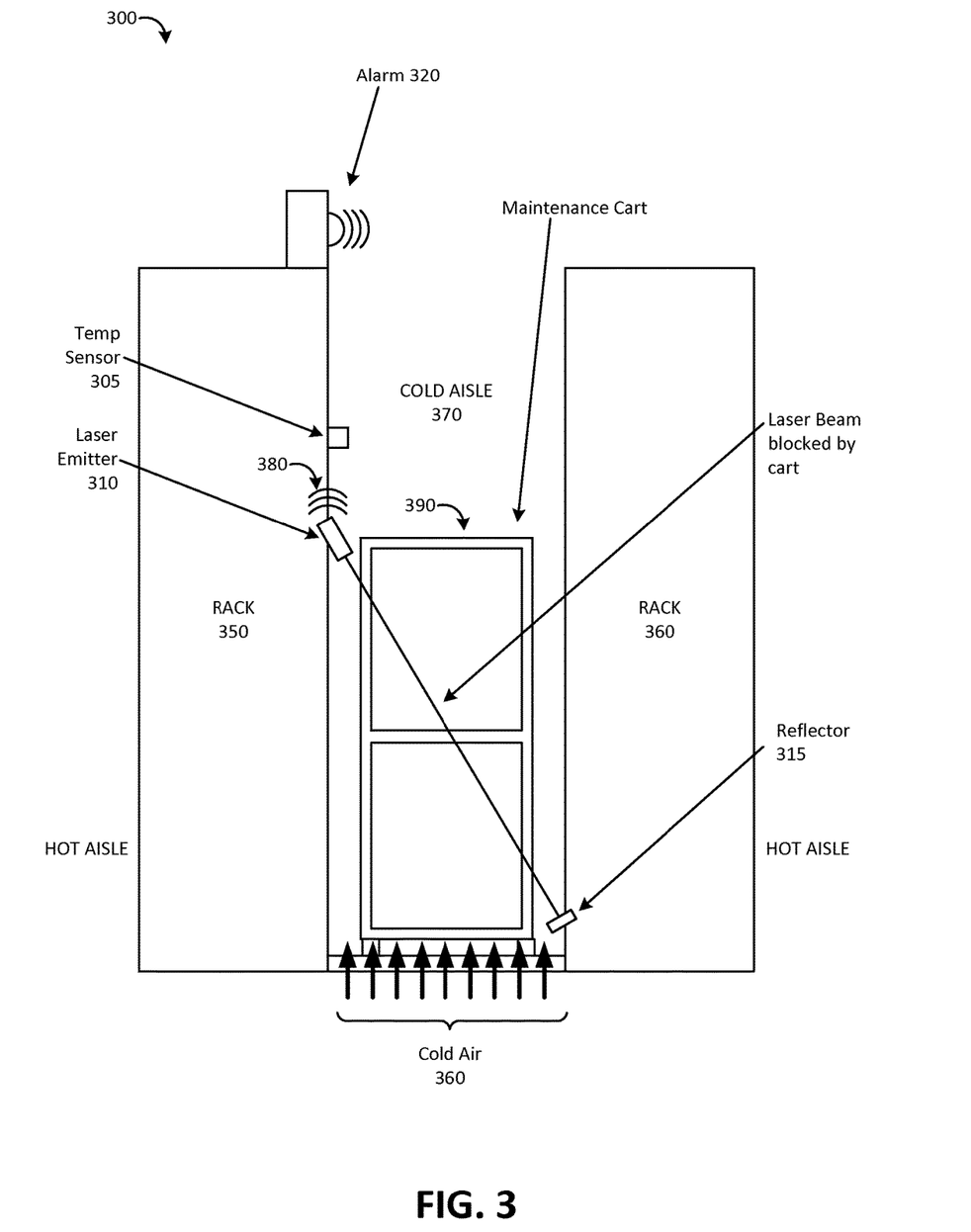
FIG. 3 illustrates another example of a system for managing computing resources in a data center according to some embodiments.

Referring to FIG. 3, illustrated is another example of a system 300 for detecting air flow obstruction in a data center. Also illustrated are equipment racks 350 and 360 that form a cold air aisle 370. A temperature sensor 305 may be installed on equipment rack 350 and may be configured to sense the ambient temperature. In this example, a laser emitter 310 (including an optical detector) is installed to generate a laser line-of-sight across the cold aisle 370 to reflector 315 which is located across the cold aisle 370 at a different elevation as compared to laser emitter 310. By locating the laser emitter 310 and reflector 315 so that the laser line-of-sight forms a diagonal across the cold aisle 370, the larger cross-section of the cold aisle 370 may be covered for obstruction detection.

In this example, laser emitter 310 may be communicatively coupled to alarm 320 using a wireless link 380. By using a wireless link, the laser emitter 310 may be more readily moved to provide area coverage by maintenance personnel. Illustrated is a maintenance cart 390 that is obstructing the flow of cold air 360. When the obstruction is detected by laser emitter 310, the laser emitter 310 may start a timer (not shown) to determine if the obstruction remains in place for a predetermined time period. If the laser emitter 310 determines that the obstruction has remained in place for the predetermined time period, a wireless signal may be sent to the alarm 320 to activate an audio or visual alarm.

Figure 4:
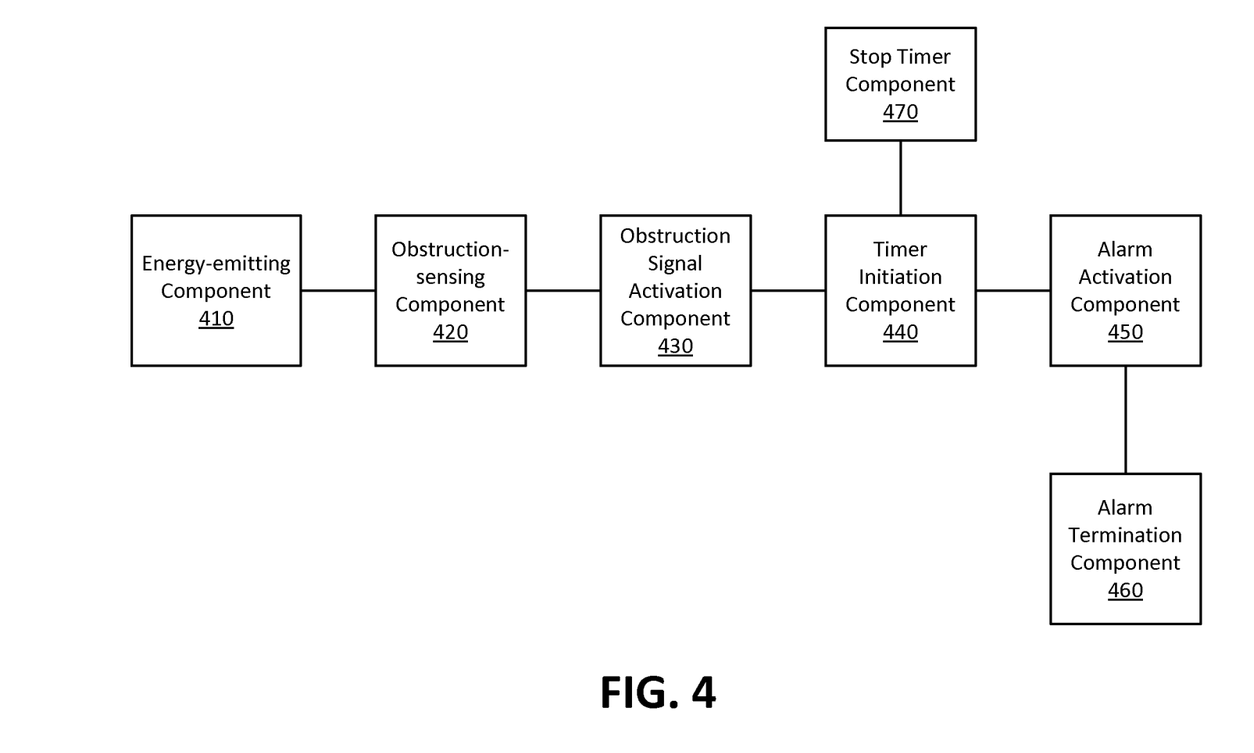
FIG. 4 illustrates an example system for managing computing resources in a data center according to some embodiments.

FIG. 4 illustrates an exemplary system for detecting air flow obstruction in a data center. An energy-emitting component 410 may be provided to emit energy across an area of the data center that is to be monitored for obstructions. When the emitted energy is blocked or interrupted, an obstruction-sensing component 420 may detect the interruption. The interruption may be interpreted as a potential obstruction of the cold air outlet of the data center. An obstruction signal activation component 430 may activate a signal when the obstruction is sensed. Based on the signal, a timer initiation component 440 may activate or initiate a timer. If the time period during which the obstruction is sensed exceeds a predetermined time period, then an alarm activation component 450 may activate an alarm, indicating that an obstruction to the cooling air outlet has been detected. If the obstruction to the cooling air outlet has been removed, then an alarm termination component 460 may deactivate the alarm, indicating that the obstruction to the cooling air outlet has been cleared. If the obstruction to the cooling air outlet is removed before the predetermined time period, then stop timer component 470 may stop and reset the timer to zero, indicating that the obstruction to the cooling air outlet has been cleared. The various components described above may be implemented as hardware or a combination of hardware and software. For example, in some embodiments the energy-emitting component 410 may be a laser and the obstruction-sensing component 420 may be a laser light sensor, while the timer initiation component 440 and the stop timer component 470 may be implemented as computer-based control system. Furthermore, some or all of the components may be combined into a single device or distributed across multiple devices.

In some embodiments, the energy-emitting component 410 can comprise a coherent light source installed in a first location of the data center and a photo detector installed in a second location of the data center. The obstruction sensing component 420 may be configured to detect presence or absence of a threshold amount of coherent light generated by the coherent light source. The obstruction signal activation component 430 may generate a first signal indicative of the absence of the threshold amount of coherent light generated by the coherence light source. The threshold amount of coherent light may be defined, for example, in terms of the signal-to-noise ratio of detected coherent light energy.

Additionally, the first and second locations may be selected so that an object or person that obstructs the cold air outlet will block, within a predetermined confidence level, coherent light generated by the coherent light source from reaching the photo detector. For example, the first location may be a first side of an aisle of the data center and the second location may be an opposing second side of the aisle of the data center. The predetermined confidence level may be determined based in part on the light source, the expected loss of light generated by the light source, the positions and geometry of the first and second locations, and environmental factors. The confidence level may be determined as a single probability value or a probability distribution function. The confidence value may be empirically derived based on experimentation, or estimated based on a probability model.

In some embodiments, the first and second locations may be selected so as to increase the likelihood that obstructions of various shapes and sizes will be detected by the obstruction sensing component 420. For example, a maintenance cart with horizontal shelving may be placed over a cold air outlet and obstruct the flow of cooling air. However, if the first and second locations are at the same height from the floor and form a line that is perpendicular to the cold aisle, then it may be possible for light traveling between the first and second locations to pass through the cart in the empty area between shelves so as not to be detected by the obstruction sensing component 420. In one embodiment, the first and second locations may be selected so as to form a non-perpendicular and non-parallel line-of-sight between the first and second locations with respect to the horizontal floor plane of the data center. For example, if the cold aisle forms the X-axis, the horizontal line perpendicular to the cold aisle forms the Y-axis, and the Z-axis is a vertical line that is perpendicular to the floor plane, then the first and second locations may be selected so that the line-of-sight between the two locations are not parallel to any of the three axes. In this way, the likelihood that the obstruction sensing component 420 will detect the presence of objects of various shapes may be increased.

Figure 5:
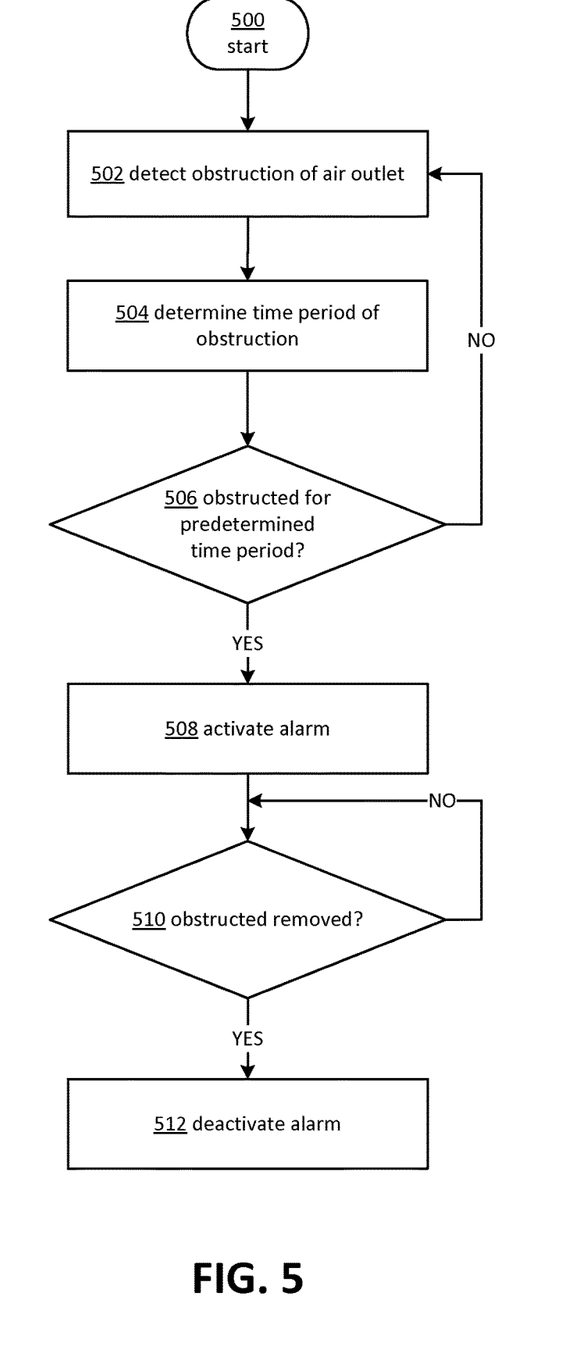
FIG. 5 is an example of an operational procedure for managing computing resources in a data center in accordance with the present disclosure.

FIG. 5 illustrates an example operational procedure for managing computing resources in a data center. In an embodiment, some or all portions of the operational procedure may be performed by a system for detecting air flow obstruction in a data center, such as system 200 illustrated in FIG. 2 and implemented by the operations illustrated in FIG. 5, which begins with operation 500 to start the operational procedure. Operation 500 may be followed by operation 502. Operation 502 illustrates detecting that an air outlet of the data center has been obstructed. In some embodiments, the detection can be performed by a sensing component configured to sense obstruction of the air outlet of the data center. The sensing component can also be configured to activate a signal when the obstruction is sensed.

The sensing component can include an emitter installed in a first location and a detector installed in a second location. The detector may be configured to detect presence or absence of a threshold amount of energy emitted by the emitter, where the absence of the threshold amount of energy may indicate the presence of some obstruction that may block the flow of cooling air. The emitter may emit any energy form such as light, sound, or other energy forms that can travel across a region of the data center. For example, the emitter may include a coherent light source, and the detector may include a photo detector. The photo detector may be configured to detect presence or absence of a threshold amount of coherent light generated by the coherence light source. Although many of the examples described herein use a coherent light source, such as a laser, other light sources can also be used. For example, some embodiments can use an infrared LED as a light source.

In some embodiments, the emitter and detector can both be installed in the same location, and a reflector can be installed in the second location. The reflector can be positioned to reflect energy emitted from the emitter back to the detector in the first location. The installation locations of the emitter and detector, or in the case of the emitter and detector being co-located, the locations of the emitter/detector and reflector, can be selected so as to form a non-perpendicular and non-parallel line-of-sight between the two locations with respect to a horizontal floor plane of the data center. Generally, the line-of-sight may be selected to avoid horizontally traversing the cold aisle so that an obstruction may avoid detection. In some embodiments, the line-of-sight may be selected to maximize the region of three-dimensional space that is traversed through a cold aisle. The line-of-sight may be selected subject to the most likely three-dimensional characteristics of objects and persons that are likely to obstruct an airflow outlet. Furthermore, in some embodiments, multiple emitters/detectors may be installed so as to provide more complete coverage of a cold air aisle.

Operation 502 may be followed by operation 504. Operation 504 illustrates in response to the detecting, determining a time period during which the air outlet is obstructed. The time period may be determined by a timing component configured to receive the signal from the sensing component and determine a time period during which the obstruction is sensed. The timing component may be configured to generate an indication in response to the obstruction being sensed for a predetermined time period. In some embodiments, a first signal may be sent by the sensing component to the timing component. The first signal may be indicative of the absence of a threshold amount of energy transmitted by an emitter of the sensing component. Responsive to the first signal, the timing component may initiate a timer configured to determine the time period during which the threshold amount of energy is not detected by the sensing component. The timing component may generate a second signal indicating that the threshold amount of energy has not been detected by the sensing component for the predetermined time period. In some embodiments, the sensing component may send a third signal indicating that the obstruction has been removed. In other embodiments, the sensing component may continue to send signals indicating the presence of the obstruction, and stop sending the signals when the obstruction has been removed.

Operation 504 may be followed by operation 506. Operation 506 illustrates determining if the air outlet is obstructed for a first predetermined time period. If the air outlet is obstructed for the first predetermined time period, then operation 506 may be followed by operation 508, which illustrates activating an alarm when the air outlet has been obstructed for the first predetermined time period. If the air outlet is not obstructed for the first predetermined time period, then operation 506 may be followed by operation 502. The alarm may be activated by an alarm component configured to activate the alarm in response to receiving the indication from the timing component.

Operation 508 may be followed by operation 510, which illustrates determining if the obstruction has been removed. If the obstruction has been removed, then operation 510 may be followed by operation 512, which illustrates deactivating the alarm. In some embodiments, the alarm may be deactivated when the air outlet of the data center is no longer obstructed for a second predetermined time period. The second predetermined time period may be determined based on a minimum time period that the obstruction must be removed before the alarm will be deactivated. For example, if the obstruction is only removed for a short time before being moved such that the air flow outlet is again obstructed, it may be not useful to deactivate the alarm until the obstruction is removed for a sufficient time so that any accumulated hotspots can dissipate.

As for the first predetermined time period, administrators of the data center may adjust this time period based at least in part on the configuration of the computing resources in the equipment racks and thermal characteristics of the equipment. For example, the first predetermined time period may be based on American Society of Heating, Refrigerating and Air-Conditioning Engineers (ASHRAE) standards for recommended temperatures, and the expected time that the recommended temperatures may be reached in the event of a blockage of the cooling airflow.

The alarm may be implemented to effectively warn local personnel that someone or some object is obstructing a cooling air outlet. Such alarms may include an audio alarm that provides aural warnings such as a siren or buzzer, a visual alarm that generates a flashing light or strobe, or various combinations thereof.

Figure 6:
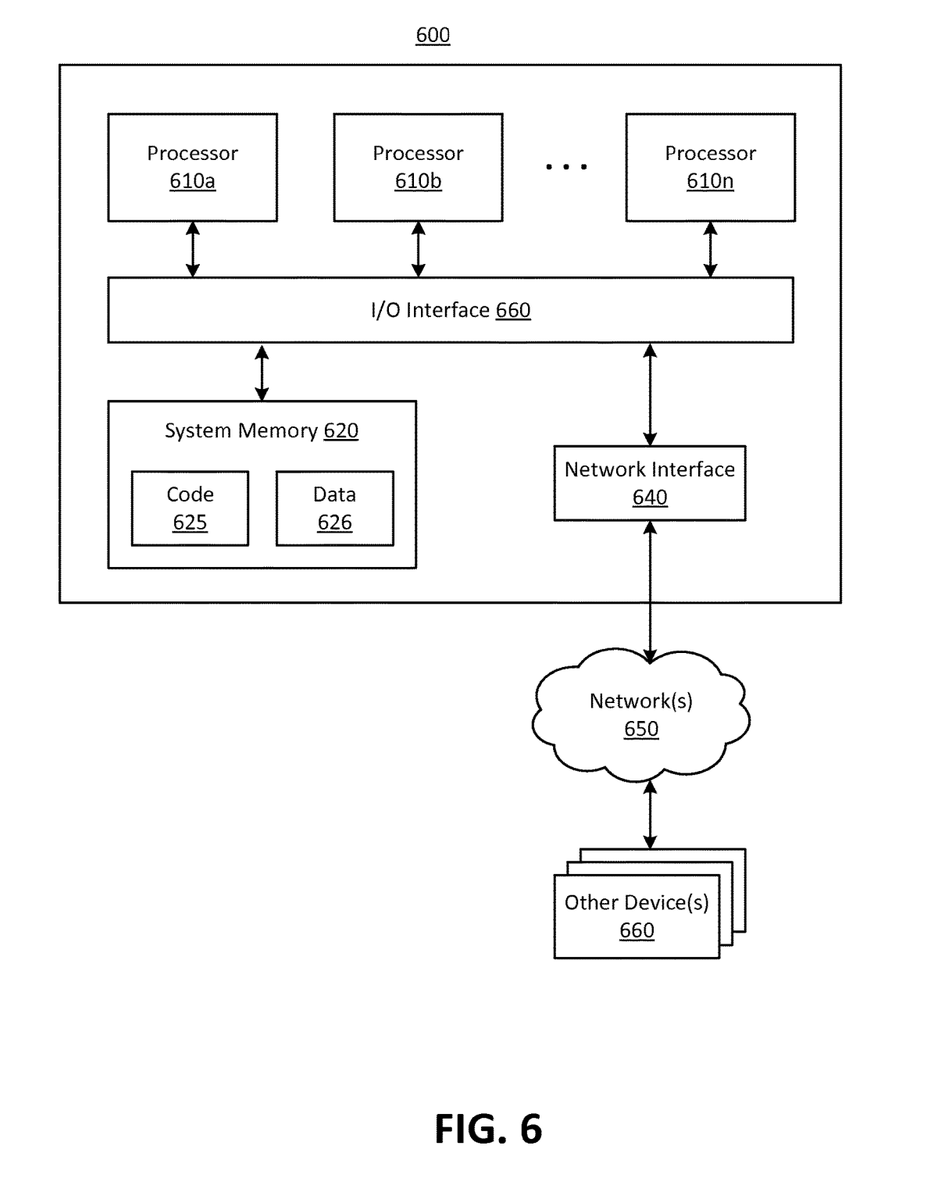
FIG. 6 is a diagram illustrating a computing environment where aspects of the present disclosure can be implemented.

In at least some embodiments, a computing device that implements a portion or all of one or more of the technologies described herein, including the techniques to detect obstruction of cooling airflow, may include a general-purpose computer system that includes or is configured to access one or more computer-accessible media. FIG. 6 illustrates such a general-purpose computing device 600. In the illustrated embodiment, computing device 600 includes one or more processors 610a, 610b, and/or 610n (which may be referred herein singularly as "a processor 610" or in the plural as "the processors 610") coupled to a system memory 620 via an input/output (I/O) interface 660. Computing device 600 further includes a network interface 640 coupled to I/O interface 660.

In various embodiments, computing device 600 may be a uniprocessor system including one processor 610 or a multiprocessor system including several processors 610 (e.g., two, four, eight, or another suitable number). Processors 610 may be any suitable processors capable of executing instructions. For example, in various embodiments, processors 610 may be general-purpose or embedded processors implementing any of a variety of instruction set architectures (ISAs), such as the x86, PowerPC, SPARC, or MIPS ISAs, or any other suitable ISA. In multiprocessor systems, each of processors 610 may commonly, but not necessarily, implement the same ISA.

System memory 620 may be configured to store instructions and data accessible by processor(s) 610. In various embodiments, system memory 620 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are shown stored within system memory 620 as code 625 and data 626.

In one embodiment, I/O interface 660 may be configured to coordinate I/O traffic between processor 610, system memory 620, and any peripheral devices in the device, including network interface 640 or other peripheral interfaces. In some embodiments, I/O interface 660 may perform any necessary protocol, timing, or other data transformations to convert data signals from one component (e.g., system memory 620) into a format suitable for use by another component (e.g., processor 610). In some embodiments, I/O interface 660 may include support for devices attached through various types of peripheral buses, such as a variant of the Peripheral Component Interconnect (PCI) bus standard or the Universal Serial Bus (USB) standard, for example. In some embodiments, the function of I/O interface 660 may be split into two or more separate components, such as a north bridge and a south bridge, for example. Also, in some embodiments some or all of the functionality of I/O interface 660, such as an interface to system memory 620, may be incorporated directly into processor 610.

Network interface 640 may be configured to allow data to be exchanged between computing device 600 and other device or devices 660 attached to a network or network(s) 650, such as other computer systems or devices as illustrated in FIGS. 1 through 6, for example. In various embodiments, network interface 640 may support communication via any suitable wired or wireless general data networks, such as types of Ethernet networks, for example. Additionally, network interface 640 may support communication via telecommunications/telephony networks, such as analog voice networks or digital fiber communications networks, via storage area networks, such as Fibre Channel SANs or via any other suitable type of network and/or protocol.

In some embodiments, system memory 620 may be one embodiment of a computer-accessible medium configured to store program instructions and data. However, in other embodiments, program instructions and/or data may be received, sent or stored upon different types of computer-accessible media. Generally speaking, a computer-accessible medium may include non-transitory storage media or memory media, such as magnetic or optical media, e.g., disk or DVD/CD coupled to computing device 600 via I/O interface 660. A non-transitory computer-accessible storage medium may also include any volatile or non-volatile media, such as RAM (e.g., SDRAM, DDR SDRAM, RDRAM, SRAM, etc.), ROM, etc., that may be included in some embodiments of computing device 600 as system memory 620 or another type of memory. Further, a computer-accessible medium may include transmission media or signals such as electrical, electromagnetic or digital signals, conveyed via a communication medium such as a network and/or a wireless link, such as may be implemented via network interface 640. Portions or all of multiple computing devices, such as those illustrated in FIG. 6, may be used to implement the described functionality in various embodiments; for example, software components running on a variety of different devices and servers may collaborate to provide the functionality. In some embodiments, portions of the described functionality may be implemented using storage devices, network devices, or special purpose computer systems, in addition to or instead of being implemented using general purpose computer systems. The term "computing device," as used herein, refers to at least all these types of devices and is not limited to these types of devices.

Figure 7:
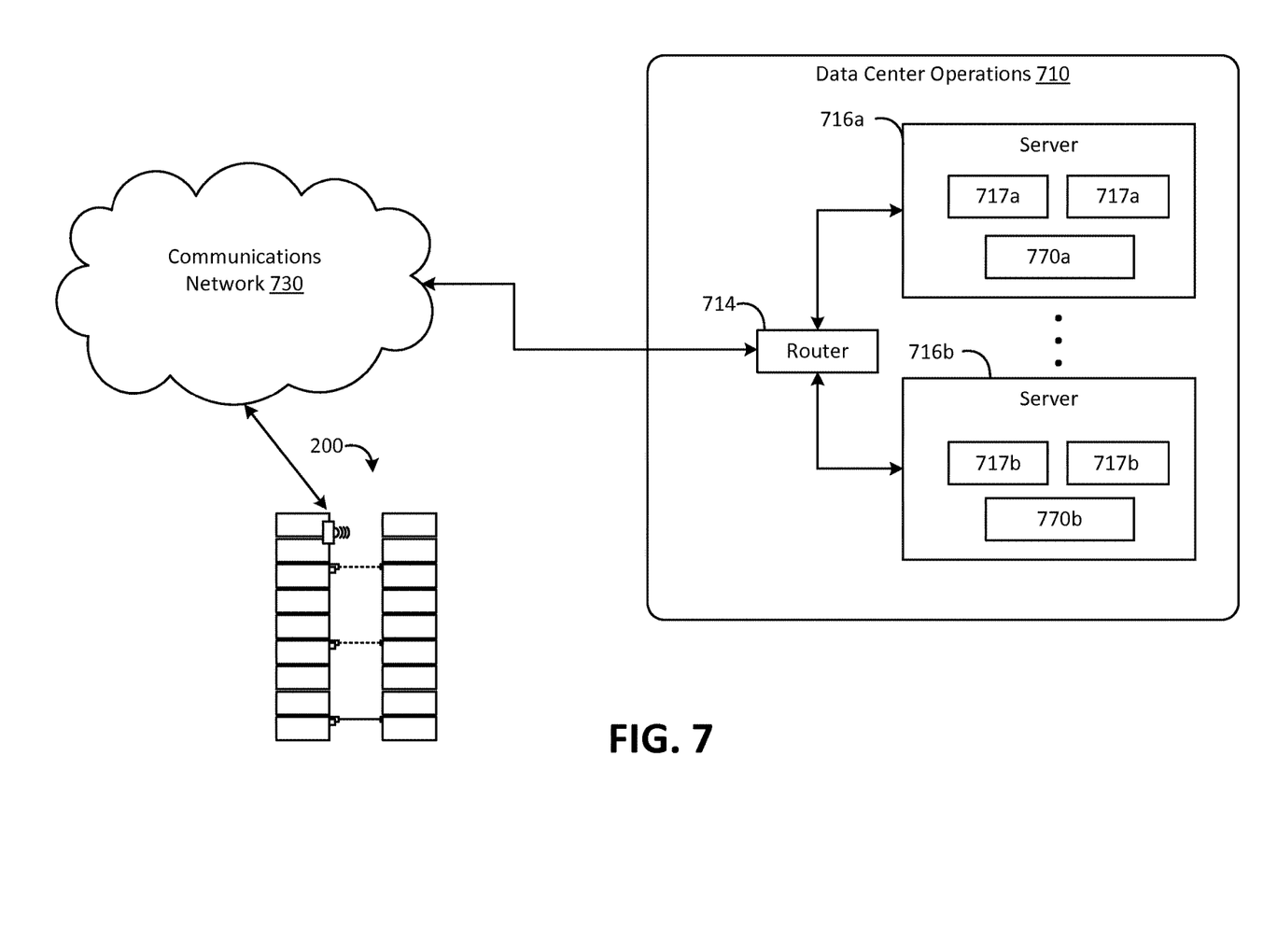
FIG. 7 is a diagram illustrating a computing environment where aspects of the present disclosure can be implemented.

FIG. 7 illustrates an example networked environment in which the embodiments described herein may be implemented. FIG. 7 is a diagram schematically illustrating an example of data center operations 710 that can provide management of computing resources in a data center. Data center operations 710 may be configured to provide manage computing resources for executing applications on a permanent or an as-needed basis. The computing resources provided by data center 710 may include various types of resources, such as data processing resources, data storage resources, data communication resources, and the like. Each type of computing resource may be general-purpose or may be available in a number of specific configurations. For example, data processing resources may be available as virtual machine instances. The instances may be configured to execute applications, including web servers, application servers, media servers, database servers, and the like. Data storage resources may include file storage devices, block storage devices, and the like.

Data center operations 710 may include servers 716a and 716b (which may be referred herein singularly as "a server 716" or in the plural as "the servers 716") that include various components such as storage devices 717a and 717b (which may be referred herein singularly as "a storage device 717" or in the plural as "the storage devices 717"). Other resources may be included in the servers such as processor blades 770a and 770b. Servers 716a and 716b shown in FIG. 7 may be standard servers configured appropriately for providing the computing resources described above and may provide computing resources for executing one or more applications.

Referring to FIG. 7, communications network 730 may, for example, be a locally accessible network of linked networks. Communications network 730 may provide access to a system 200 for monitoring air flow obstructions as illustrated in FIG. 2.

A router 714 may be utilized to interconnect the servers 716a and 716b. Router 714 may also be connected to communications network 730. Router 714 may manage communications within networks in data center operations 710, for example, by forwarding packets or other data communications as appropriate based on characteristics of such communications (e.g., header information including source and/or destination addresses, protocol identifiers, etc.) and/or the characteristics of the private network (e.g., routes based on network topology, etc.). It will be appreciated that, for the sake of simplicity, various aspects of the computing systems and other devices of this example are illustrated without showing certain conventional details. Additional computing systems and other devices may be interconnected in other embodiments and may be interconnected in different ways.

It should be appreciated that the network topology illustrated in FIG. 7 has been greatly simplified and that many more networks and networking devices may be utilized to interconnect the various computing systems disclosed herein. These network topologies and devices should be apparent to those skilled in the art.

It should also be appreciated that data center operations 710 described in FIG. 7 is merely illustrative and that other implementations might be utilized. Additionally, it should be appreciated that the functionality disclosed herein might be implemented in software, hardware, or a combination of software and hardware. Other implementations should be apparent to those skilled in the art. It should also be appreciated that a server, gateway, or other computing device may comprise any combination of hardware or software that can interact and perform the described types of functionality, including without limitation desktop or other computers, database servers, network storage devices and other network devices, PDAs, tablets, cellphones, wireless phones, pagers, electronic organizers, Internet appliances, television-based systems (e.g., using set top boxes and/or personal/digital video recorders), and various other consumer products that include appropriate communication capabilities. In addition, the functionality provided by the illustrated modules may in some embodiments be combined in fewer modules or distributed in additional modules. Similarly, in some embodiments the functionality of some of the illustrated modules may not be provided and/or other additional functionality may be available.

The above described aspects of the disclosure have been described with regard to certain examples and embodiments, which are intended to illustrate but not to limit the disclosure. It should be appreciated that the subject matter presented herein extends to and encompasses such modifications and/or enhancements that will be apparent to persons skilled in the art in view of the detailed description provided herein.

The various features described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without author input or prompting, whether these features, elements, and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

What is claimed is:

1. A system for detecting air flow blockage in a data center, the system comprising:
   a detector comprising a laser and an optical sensor, the detector configured to:
      sense, using the optical sensor, obstruction of laser light generated by the laser across an aisle of the data center of; and
      activate a signal indicating obstruction of a cold air outlet of the data center;
   a timer communicatively coupled to the detector and operable to:
      receive the signal from the detector and determine a time period during which the obstruction of the cold air outlet is indicated; and
      generate an indication in response to the obstruction of the cold air outlet being sensed for a predetermined time period, wherein the predetermined time period is selected based at least in part on thermal characteristics of equipment in the data center; and
   an alarm subsystem in communication with the timer and configured to activate an alarm in response to receiving the indication from the timer.

2. The system of claim 1, wherein the detector is installed at a first side of the aisle of the data center, the system further comprising a reflector installed at an opposing second side of the aisle of the data center, the reflector configured to reflect the laser light to the optical sensor.

3. The system of claim 1, wherein the optical sensor is operable to sense presence or absence of a threshold amount of laser light generated by the laser; and wherein the detector is configured to activate the signal when the threshold amount of laser light is sensed.

4. The system of claim 1, wherein the laser is installed at a first side of the aisle of the data center and the optical sensor is installed at an opposing side of the aisle of the data center.

5. The system of claim 1, wherein the laser is configured to transmit laser light that forms a non-perpendicular and non-parallel line-of-sight with respect to a horizontal floor plane of the data center.

6. A method, comprising:
   detecting that an air outlet of a data center has been obstructed;
   in response to the detecting, determining a time period during which the air outlet is obstructed; and
   activating an alarm when the air outlet has been obstructed for a first predetermined time period, wherein the first predetermined time period is selected based at least in part on thermal characteristics of equipment in the data center.

7. The method of claim 6, further comprising deactivating the alarm when the air outlet of the data center is no longer obstructed.

8. The method of claim 7, wherein the alarm is deactivated when the air outlet of the data center is no longer obstructed for a second predetermined time period.

9. The method of claim 6, wherein the alarm comprises an audio alarm, a visual alarm, or a combination thereof.

10. The method of claim 6, wherein the first predetermined time period is determined by a countdown timer comprising a capacitor and potentiometer.

11. The method of claim 6, wherein said detecting is determined by detecting presence or absence of energy transmitted between a first location of the data center and a second location of the data center.

12. The method of claim 11, wherein said energy is coherent light.

13. The method of claim 11, wherein the first and second locations are selected so as to form a non-perpendicular and non-parallel line-of-sight between the first and second locations with respect to a horizontal floor plane of the data center.

14. The method of claim 11, wherein the first predetermined time period is determined by a device configured to:
   receive a first signal indicative of the presence or absence of energy;
   responsive to the first signal, initiate a timer configured to determine the first predetermined time period during which the absence of energy is detected; and
   generate a second signal indicating that the absence of energy has been detected for the first predetermined time period.

15. The method of claim 6, further comprising sending an indication that the air outlet has been obstructed for the first predetermined time period.

16. A system for a data center, comprising:
- a sensing component configured to sense obstruction of an air outlet of the data center and to activate a signal when the obstruction is sensed;
- a timing component configured to:
  - receive the signal from the sensing component and determine a time period during which the obstruction is sensed; and
  - generate an indication in response to the obstruction being sensed for a predetermined time period, wherein the predetermined time period is selected based at least in part on configuration of computing resources and thermal characteristics of equipment in the data center; and
- an alarm component configured to activate an alarm in response to receiving the indication from the timing component.

17. The system of claim 16, wherein said sensing component comprises a coherent light source and photo detector installed in a first location of the data center and a reflector installed in a second location of the data center, the photo detector configured to detect presence or absence of a threshold amount of coherent light reflected by the reflector.

18. The system of claim 16, wherein said sensing component comprises an emitter installed in a first location of the data center and a detector installed in a second location of the data center, the detector configured to detect presence or absence of a threshold amount of energy emitted by the emitter.

19. The system of claim 16, wherein the obstruction is sensed based at least in part on a line-of-sight that is non-perpendicular and non-parallel with respect to a horizontal floor plane of the data center.

20. The system of claim 1, wherein the predetermined time period is selected based at least in part on an expected time for a first temperature to be reached during the air flow blockage.

* * * * *